(12) United States Patent
Grote et al.

(10) Patent No.: US 10,600,879 B2
(45) Date of Patent: Mar. 24, 2020

(54) TRANSISTOR TRENCH STRUCTURE WITH FIELD PLATE STRUCTURES

(71) Applicant: NXP USA, INC., Austin, TX (US)

(72) Inventors: Bernhard Grote, Phoenix, AZ (US); Saumitra Raj Mehrotra, Scottsdale, AZ (US); Ljubo Radic, Gilbert, AZ (US); Vishnu Khemka, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/918,563

(22) Filed: Mar. 12, 2018

(65) Prior Publication Data

US 2019/0280094 A1 Sep. 12, 2019

(51) Int. Cl.
*H01L 29/40* (2006.01)
*H01L 29/423* (2006.01)
*H01L 29/66* (2006.01)
*H01L 27/088* (2006.01)
(Continued)

(52) U.S. Cl.
CPC ........ *H01L 29/4236* (2013.01); *H01L 27/088* (2013.01); *H01L 29/404* (2013.01); *H01L 29/407* (2013.01); *H01L 29/66666* (2013.01); *H01L 29/7803* (2013.01); *H01L 29/7813* (2013.01); *H01L 29/7827* (2013.01); *H01L 21/823487* (2013.01)

(58) Field of Classification Search
CPC .................................................... H01L 29/407
See application file for complete search history.

(56) References Cited

U.S. PATENT DOCUMENTS

| 4,553,151 | A | | 11/1985 | Schutten et al. |
| 5,316,959 | A | * | 5/1994 | Kwan ................. H01L 29/0619 438/270 |
| 5,324,683 | A | | 6/1994 | Fitch et al. |

(Continued)

FOREIGN PATENT DOCUMENTS

WO 2005093841 A2 10/2005

OTHER PUBLICATIONS

Ex-Parte Quayle action dated Apr. 24, 2019 in U.S. Appl. No. 15/715,852.

(Continued)

*Primary Examiner* — Julio J Maldonado
*Assistant Examiner* — Omar F Mojaddedi
(74) *Attorney, Agent, or Firm* — David G. Dolezal

(57) ABSTRACT

A trench structure is located directly laterally between a first well and a first source region for a first transistor and the second well region with a second source for a second transistor. The trench structure includes a first gate structure for the first transistor, a second gate structure for the second transistor, a first conductive field plate structure, and a second conductive field plate structure. The first gate structure, the first field plate structure, the second field plate structure, and the second gate structure are located in the trench structure in a lateral line between the first well region and the second well region. The trench structure includes a dielectric separating the first field plate structure and the second field plate structure from each other in the lateral line. A drain region for the first transistor and the second transistor includes a portion located directly below the trench structure.

10 Claims, 14 Drawing Sheets

(51) Int. Cl.
*H01L 29/78* (2006.01)
*H01L 21/8234* (2006.01)

(56) References Cited

U.S. PATENT DOCUMENTS

| | | | |
|---|---|---|---|
| 5,407,860 | A | 4/1995 | Stoltz et al. |
| 5,434,435 | A | 7/1995 | Baliga |
| 5,723,891 | A | 3/1998 | Malhi |
| 5,736,446 | A | 4/1998 | Wu et al. |
| 5,770,507 | A | 6/1998 | Chen et al. |
| 5,869,379 | A | 2/1999 | Gardner et al. |
| 5,914,519 | A | 6/1999 | Chou et al. |
| 6,064,107 | A | 5/2000 | Yeh et al. |
| 6,277,700 | B1 | 8/2001 | Yu et al. |
| 6,858,500 | B2 | 2/2005 | Sugi et al. |
| 6,861,332 | B2 | 3/2005 | Park et al. |
| 6,864,135 | B2 | 3/2005 | Grudowski et al. |
| 6,946,348 | B2 | 9/2005 | Zeng |
| 7,368,785 | B2 | 5/2008 | Chen et al. |
| 7,400,024 | B2 | 7/2008 | Kunnen |
| 7,576,388 | B1 | 8/2009 | Wilson et al. |
| 7,709,889 | B2 | 5/2010 | Moens et al. |
| 7,759,206 | B2 | 7/2010 | Luo et al. |
| 7,800,167 | B2 | 9/2010 | Kitamura et al. |
| 7,893,488 | B2 | 2/2011 | Hebert |
| 7,923,776 | B2 | 4/2011 | Yilmaz et al. |
| 8,043,913 | B2 | 10/2011 | Yilmaz et al. |
| 8,304,312 | B2 | 11/2012 | Hebert |
| 8,319,278 | B1 | 11/2012 | Zeng et al. |
| 8,329,538 | B2 | 12/2012 | Pan et al. |
| 8,502,287 | B2 | 8/2013 | Radic et al. |
| 8,647,950 | B2 | 4/2014 | Zuniga et al. |
| 8,716,794 | B2 | 5/2014 | Luo et al. |
| 8,981,470 | B2 | 3/2015 | Nozu |
| 9,171,931 | B2 | 10/2015 | Ng et al. |
| 9,559,198 | B2 | 1/2017 | Stefanov et al. |
| 9,620,583 | B2 | 4/2017 | Kelkar et al. |
| 2004/0021233 | A1 | 2/2004 | Kinzer et al. |
| 2004/0022123 | A1 | 2/2004 | Kinzer et al. |
| 2006/0001084 | A1* | 1/2006 | Kelly ............... H01L 29/407 257/329 |
| 2006/0017078 | A1* | 1/2006 | Thapar ............. H01L 29/407 257/284 |
| 2006/0209586 | A1* | 9/2006 | Hirler ............... H01L 29/4236 365/149 |
| 2009/0256212 | A1 | 10/2009 | Denison et al. |
| 2010/0015770 | A1 | 1/2010 | Tai et al. |
| 2010/0244125 | A1 | 9/2010 | Sonsky et al. |
| 2013/0181723 | A1 | 7/2013 | Mauder et al. |
| 2013/0334565 | A1 | 12/2013 | Hutzler et al. |
| 2014/0021534 | A1 | 1/2014 | Verma et al. |
| 2014/0097492 | A1 | 4/2014 | Yu |
| 2014/0138739 | A1 | 5/2014 | Magri et al. |
| 2014/0225186 | A1 | 8/2014 | Abou-Khalil et al. |
| 2015/0137223 | A1* | 5/2015 | Siemieniec ....... H01L 29/7813 257/331 |
| 2015/0380348 | A1 | 12/2015 | Noebauer et al. |
| 2015/0380538 | A1 | 12/2015 | Ogawa |
| 2016/0211348 | A1 | 7/2016 | Yoshida |
| 2016/0359029 | A1* | 12/2016 | Zeng ................ H01L 29/7397 |
| 2017/0263767 | A1 | 9/2017 | Nishiwaki |
| 2017/0338337 | A1 | 11/2017 | Bobde et al. |
| 2018/0006109 | A1 | 1/2018 | Mauder et al. |
| 2018/0090490 | A1 | 3/2018 | Lin et al. |
| 2019/0097046 | A1 | 3/2019 | Mehrotra et al. |

OTHER PUBLICATIONS

U.S. Appl. No. 16/141,674, filed Sep. 25, 2018, entitled "Transistor Devices With Control-Terminal Field Plate Structures in Trenches".
Cha, H., "0.18um 100V-rated BCD with Large Area Power LDMOS with ultra-low effective Specific Resistance", IEEE 2016.
Cheng, K., "Air Spacer for 10nm FinFET CMOS and Beyond", IEEE 2016.
Chil, M., "Advanced 300mm 130NM BCD technology from 5V to 85V with Deep-Trench Isolation", IEEE 2016.
Fujishima, D.H., "Integrated Bi-directional Trench Lateral Power MOSFETs for One Chip Lithium-ion Battery Protection ICs", Proceedings of the 17 International Symposium on Power Semiconductor Devices & IC's, Santa Barbara, CA, May 23-26, 2005.
Yang, H., "Low-Leakage SMARTMOS 10W Technology at 0.13um Node with Optimized Analog, Power and Logic Devices for SOC Design", IEEE 2008.
Yang, H., "Approach to the Silicon Limit: Advanced NLDMOS in 0.13 um SOI Technology for Automotive and Industrial Applications up to 110V", Proceedings of the 25th International Symposium on Power Semiconductor Devices & ICs, Kanazawa, 2013.
Zhigang, W., "Analysis of OFF-state and ON-state performance in a silicon-on-insulator power MOSFET with a low-k dielectric trench", Chinese Institute of Electronics, Journal of Semiconductors, vol. 34, No. 7, Jul. 2013.
U.S. Appl. No. 15/715,816, filed Sep. 26, 2017, entitled "Field-Effect Transistor and Method Therefor".
U.S. Appl. No. 15/715,831, filed Sep. 26, 2017, entitled "Field-Effect Transistor and Method Therefor".
U.S. Appl. No. 15/715,852, filed Sep. 26, 2017, entitled "Field-Effect Transistor and Method Therefor".
Non-final office action dated Nov. 16, 2018 in U.S. Appl. No. 15/715,852.
U.S. Appl. No. 16/205,461, filed Nov. 30, 2018, entitled "Transistor With Gate/Field Plate Structure".
Non-final office action dated Feb. 21, 2019 in U.S. Appl. No. 15/715,816.
Ex-Parte Quayle action dated Mar. 5, 2019 in U.S. Appl. No. 15/715,852.
Non-final office action dated Apr. 9, 2019 in U.S. Appl. No. 15/715,831.
Huang, T., "0.18um BCD Technology with Best-in-Class LDMOS from 6 V to 45 V", Proceedings of the 26th International Symposium on Power Semiconductor Devices & IC's, Jun. 15-19, 2014.
Kumar, M., "Extended-p+ Stepped Gate LDMOS for Improved Performance", IEEE Transactions on Electron Devices, vol. 57, No. 7, Jul. 2010.
Lu, D.H., "Integrated Bi-directional Trench Lateral Power MOSFETs for One Chip Lithium-ion Battery Protection ICs", Proceedings of the 17th International Symposium on Power Semiconductor Devices & IC's, May 23-26, 2005.
Takaya, H., "Floating Island and Thick Bottom Oxide Trench Gate MOSFET (FITMOS)—A 60V Ultra Low On-Resistance Novel MOSFET with Superior Internal Body Diode—", Proceedings of the 17th International Symposium on Power Semiconductor Devices & IC's, May 23-26, 2005.
U.S. Appl. No. 16/171,830, filed Oct. 26, 2018, entitled "Transistor Devices With Extended Drain Regions Located in Trench Sidewalls".
U.S. Appl. No. 16/174,955, filed Oct. 30, 2018, entitled "Vertical Transistor With Extended Drain Region".
Non-final office action dated Oct. 15, 2018 in U.S. Appl. No. 15/715,816.
Notice of Allowance dated Sep. 25, 2019 in U.S. Appl. No. 15/715,831.
Final office action dated Nov. 19, 2019 in U.S. Appl. No. 15/715,816.
Final office action dated Jun. 7, 2019 in U.S. Appl. No. 15/715,816.
Notice of Allowance dated Jul. 9, 2019 in U.S. Appl. No. 15/715,852.
Final office action dated Jul. 18, 2019 in U.S. Appl. No. 15/715,831.
Non-final office action dated Aug. 8, 2019 in U.S. Appl. No. 15/715,816.
U.S. Appl. No. 16/692,517, filed Nov. 22, 2019, entitled "Transistor Formed With Spacer".
U.S. Appl. No. 16/715,396, filed Dec. 16, 2019, entitled "Transistor With Extended Drain Region".
Ex-Parte Quayle dated Jan. 7, 2020 in U.S. Appl. No. 16/174,955.
Notice of Allowance dated Jan. 21, 2020 in U.S. Appl. No. 15/715,816.

* cited by examiner

TRANSISTOR TRENCH STRUCTURE WITH FIELD PLATE STRUCTURES

BACKGROUND OF THE INVENTION

Field of the Invention

This invention relates in general to semiconductor devices and more specifically to transistors with trench structures having field plates.

Background

Some types of transistors include transistor structures located in a trench structure of a substrate. For example, some types of transistors include gate structures located in a trench structure.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

Figure 1:
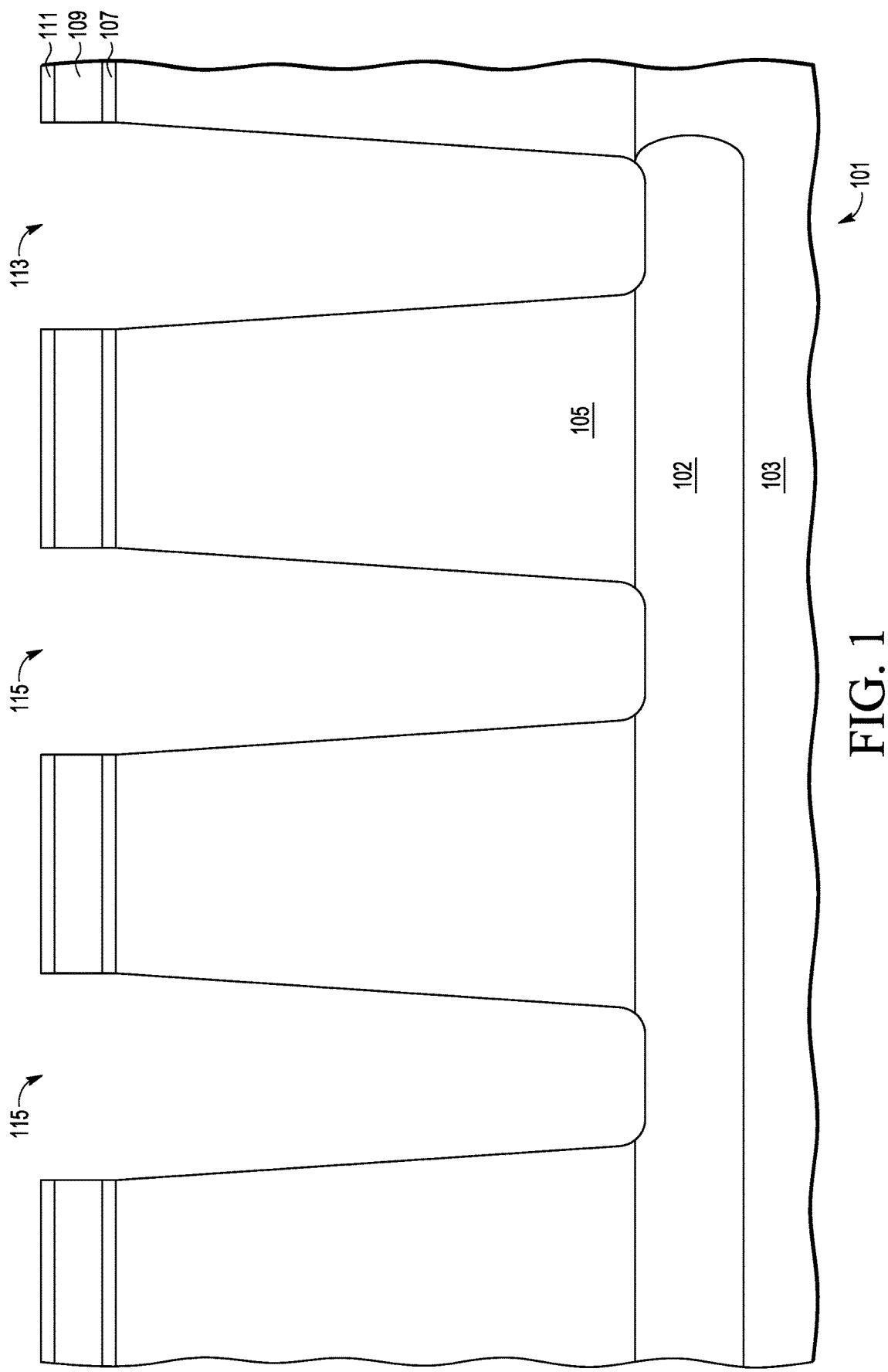
FIGS. 1 and 4-12 set forth partial cutaway side views of various stages in the manufacture of a semiconductor device according to one embodiment of the present invention.

The following sets forth a detailed description of a mode for carrying out the invention. The description is intended to be illustrative of the invention and should not be taken to be limiting.

As disclosed herein, a trench structure is located directly laterally between a first well and a first source region for a first transistor and the second well region with a second source for a second transistor. The trench structure includes a first gate structure for the first transistor, a second gate structure for the second transistor, a first conductive field plate structure, and a second conductive field plate structure. The first gate structure, the first field plate structure, the second field plate structure, and the second gate structure are located in the trench structure in a lateral line between the first well region and the second well region. The trench structure includes a dielectric separating the first field plate structure and the second field plate structure from each other in the lateral line. A drain region for the first transistor and the second transistor includes a portion located directly below the trench structure.

In one embodiment, the first and second transistors described above have a back to back transistor configuration and are part of a bidirectional transistor device which can be implemented as a bidirectional switch. The field plate structures are spaced apart and can be biased at different voltages where an electrostatic field between the two field plate structures is located in a dielectric between the two field plate structures. Accordingly, with some such embodiments, the dielectric spacing between the gates for each transistor and field plates of each transistor can be significantly reduced, thereby reducing the width of the trench structure.

Bi-directional switches can be used in applications that require voltage blocking capability in both directions. In one example, a bi-directional switch is utilized in a reverse auto battery protection application. With some examples, the break-down voltage requirement can range from +130 Volts (V) in each direction. Some conventional power MOSFETs are unidirectional where placing them in a back to back configuration doubles the source to drain resistance as well as the device area, such that the back-to-back on-resistance area (RonA) is quadruple the unidirectional device RonA. Consequently, with such an implementation based on back-to-back configuration of conventional power MOSFETS, four times the area is needed to achieve the same on-resistance as with a single unidirectional switch.

Embodiments described herein can be utilized as bi-directional transistor device with vertical FETs where the gate for each transistor is located on opposing sides of a trench structure. Field plate structures for each transistor are also located in the trench structure that when coupled to either the source or gate of the transistor, allow for supporting the voltage in a vertical direction from the source of the transistor to a shared drain that has a portion located directly under the trench structure. Accordingly, area requirements for higher voltage devices can be reduced. In some embodiments, by providing two separate field plate structures that can be conveniently tied to source or gate potentials, the voltage withstand requirement for the dielectric between gate region and adjacent field plate is reduced to that of the gate-source voltage rating determined by the gate dielectric. In some embodiments, the dielectric between the field plates is of sufficient thickness to support the required source-source voltage, while the thickness of the field oxide between field plate and adjacent extended drain drift region can be optimized to achieve low RonA.

Figure 2:
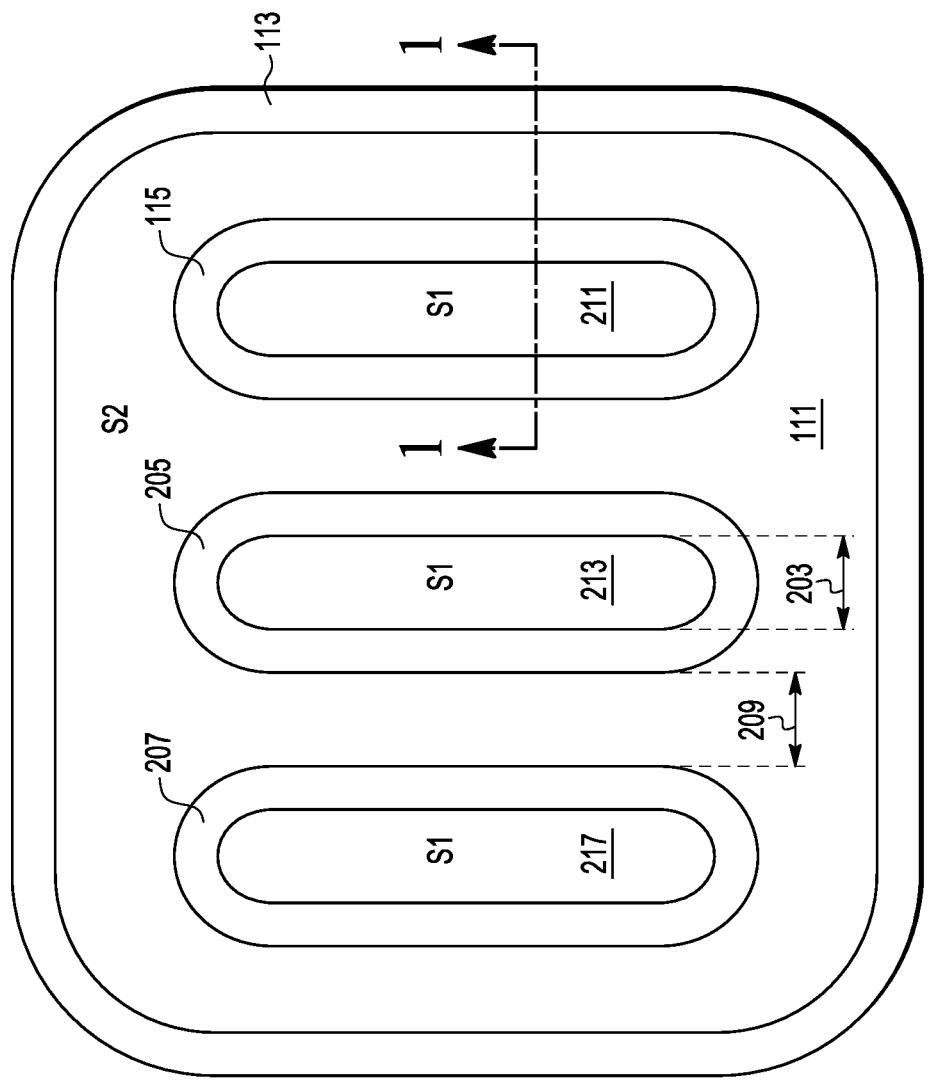
FIG. 2 sets forth a partial top view of a stage in the manufacture of a semiconductor device according to one embodiment of the present invention.
Figure 3:
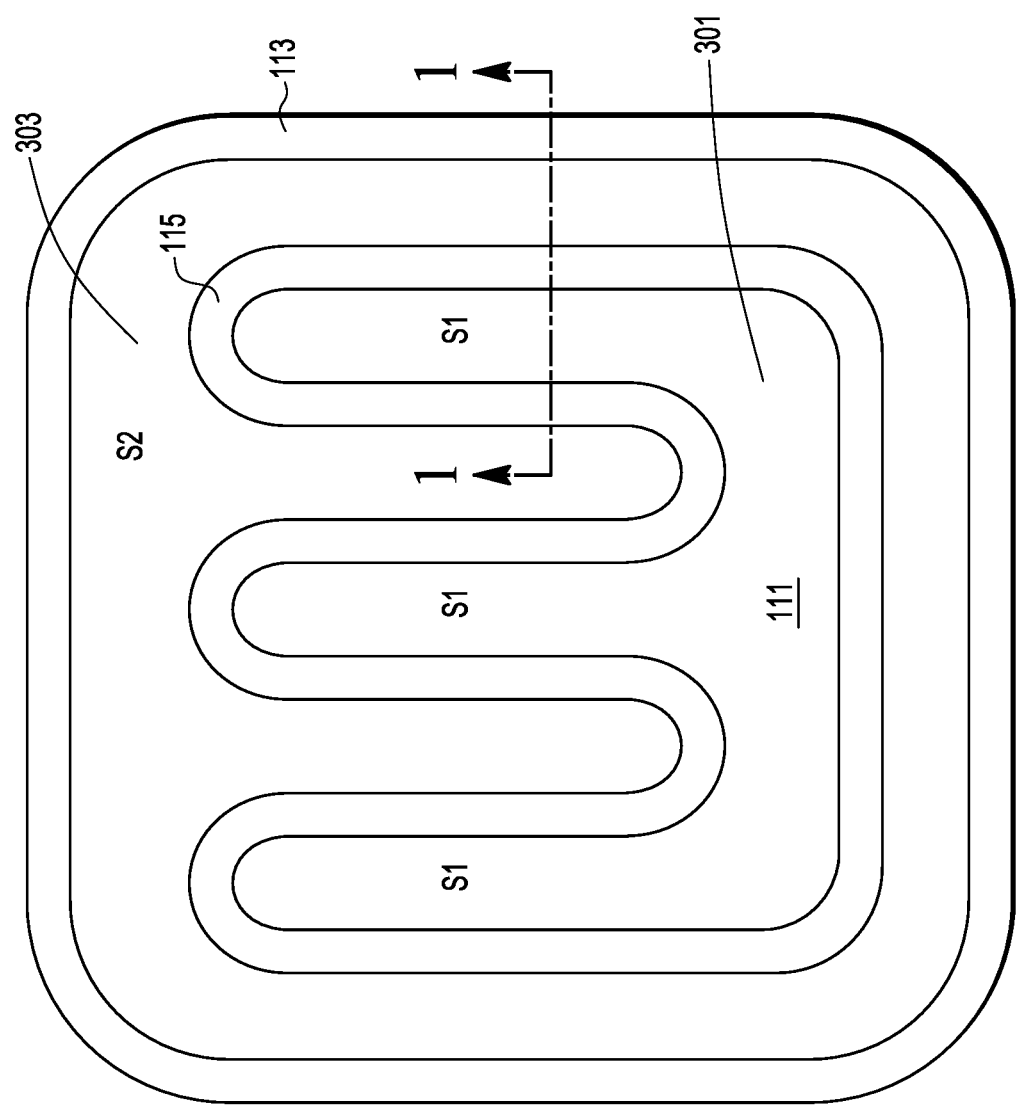
FIG. 3 sets forth a partial top view of a stage in the manufacture of a semiconductor device according to another embodiment of the present invention.

FIGS. 1 and 4-12 set forth partial cutaway side views of various stages in the manufacture of a bi-directional transistor device with a trench structure according to one embodiment of the present invention. FIGS. 2 and 3 set forth partial top views of a wafer during a stage in manufacture according to two different embodiments of the present invention. The location of the cutaway side view of FIG. 1 is shown in FIGS. 2 and 3.

FIG. 1 is a partial cutaway side view showing a top portion of wafer 101 with trenches 115 and 113 formed therein. In one embodiment, wafer 101 includes a semiconductor substrate 103 that has a net P-type conductivity doping. In one embodiment, substrate 103 is doped with boron and has a net P-type conductivity concentration of about 2e15 cm−3, but may be doped with other types of dopants and/or may be at other concentrations in other embodiments. In one embodiment, substrate 103 is made of monocrystalline silicon, but may be made of other semiconductor materials (e.g. silicon germanium, germanium, silicon carbide, gallium nitride, gallium arsenide, other semiconductor III-V materials) in other embodiments.

In the embodiment shown, wafer 101 includes a buried heavy N-type conductivity region 102. In one embodiment, region 102 is doped with an N-type dopant such as antimony at a dosage of about 1e15 cm−2 and energy of 80 keV, but may be doped with other dopants, energies, and/or concentrations. In some embodiments, region 102 may be formed with multiple implantation steps, each having different dopants, energies, and/or concentrations. For example, in addition to the implantation of antimony, phosphorus may be implanted at a dosage of 5e12 cm−2 and at an energy of 900 keV in some embodiments. In some embodiments, utilizing a buried heavy N-type region may improve the symmetry of electrical properties in the forward and reverse bias directions of the bidirectional device as well as reduce the RonA of the device during operation by improving the conductivity of at least a portion of the virtual drain region during operation. Furthermore, relatively high doping in region 102 suppresses the parasitic PNP transistor formed between well regions and substrate. Other embodiments do not include a buried heavy N-type region similar to region 102.

Wafer 101 includes a lighter doped N type layer 105 located over substrate 103. In one embodiment, layer 105 is doped with an N-type dopant but at a lighter concentration than region 102. In one embodiment, layer 105 is doped with arsenic or phosphorous at a concentration of about 4e16 cm−3 to support a breakdown voltage (BV) >60V in either direction, but may include other conductivity dopants and/or be at other concentrations in other embodiments, and for other BV targets. In one embodiment, region 102 may overhang trench 113 as convenient for termination design.

In one embodiment, layer 105 is epitaxially grown from substrate 103. In one embodiment, layer 105 is made of monocrystalline silicon, but may be made of other semiconductor material in other embodiments. In one embodiment, the N-type dopants are formed in-situ during the epitaxial growth process, but may be implanted after formation in other embodiments. In one embodiment, region 102 has a thickness of about 1.5 um and layer 105 has a thickness of 4.0 μm, but each may be of other thicknesses in other embodiments, and for other BV targets. In one embodiment, layer 105 may be part of substrate 103 which is subsequently implanted with N-type dopants, e.g. in an embodiment that does not include region 102.

A pad oxide layer 107, nitride layer 109, and oxide layer 111 are formed on layer 105. Afterwards, trenches 115 and 113 are formed in wafer 101. In one embodiment, trenches 115 and 113 have a width of 1.5 um and a depth of 4 um, but may have other widths and/or depths in other embodiments. In one embodiment, the trenches are formed by forming a patterned mask (not shown) on wafer 101 and then etching layers 111, 109, 107, and layer 105 as per the pattern with the appropriate etch chemistries. In other embodiments, other types of hard mask layers may be utilized in forming trenches 115 and 113.

FIGS. 2 and 3 are partial top views of wafer 101 showing the extent of trenches 113 and 115 in wafer 101 according to two different embodiments. FIG. 2 shows that trench 115 has an oval shape and is similar to trenches 205 and 207. Trench 113 is a termination trench that surrounds trenches 207, 205, and 115. Trenches 207, 205, and 115 define pillar areas 217, 213, and 211, respectively. In one embodiment, termination trench 113 has the same width and depth as interior trenches (115), but in other embodiments, it may have a different width and/or depth.

Areas 217, 213, and 211 are labeled "S1" and will after subsequent stages include source regions that will be electrically coupled together to be biased at the same potential during operation. The area between trench 113 and trenches 207, 205, and 115 is labeled "S2" and includes source regions that will be electrically coupled together to be biased at the same potential during operation. Dimensions 209 represents the spacing between trenches 207 and 205 and dimension 203 represents the width of area 213. In one embodiment, these dimensions are the same (e.g. about 1 um), but may be different in other embodiments.

FIG. 3 shows an alternative embodiment where area 301 and area 303 form interdigitated comb structures separated by trench 115. Area 301 is surrounded by trench 115 and is labeled "S1" in FIG. 3. Area 301 includes source regions that will be electrically coupled together to be biased at the same potential during operation. Area 303 is outside of trench 115 and inside of trench 113. Area 303 is labeled "S2" in FIG. 3 and includes source regions that will be electrically coupled together to be biased at the same potential during operation. In other embodiments, the trenches may have different configurations and have different lengths, widths, number of comb fingers and/or spacings depending upon the desired parameters of the bi-directional transistors including the "effective" widths of the bi-directional transistors.

FIGS. 1 and 4-12 show a partial cutaway view of the bi-directional transistor device being manufactured in the areas shown in FIGS. 2 and 3. A full view of the device along the cross section of FIGS. 1 and 4-12 would show 8 trench cross sections instead of the three trench cross sections shown in the views of FIGS. 1 and 4-12.

Figure 4:
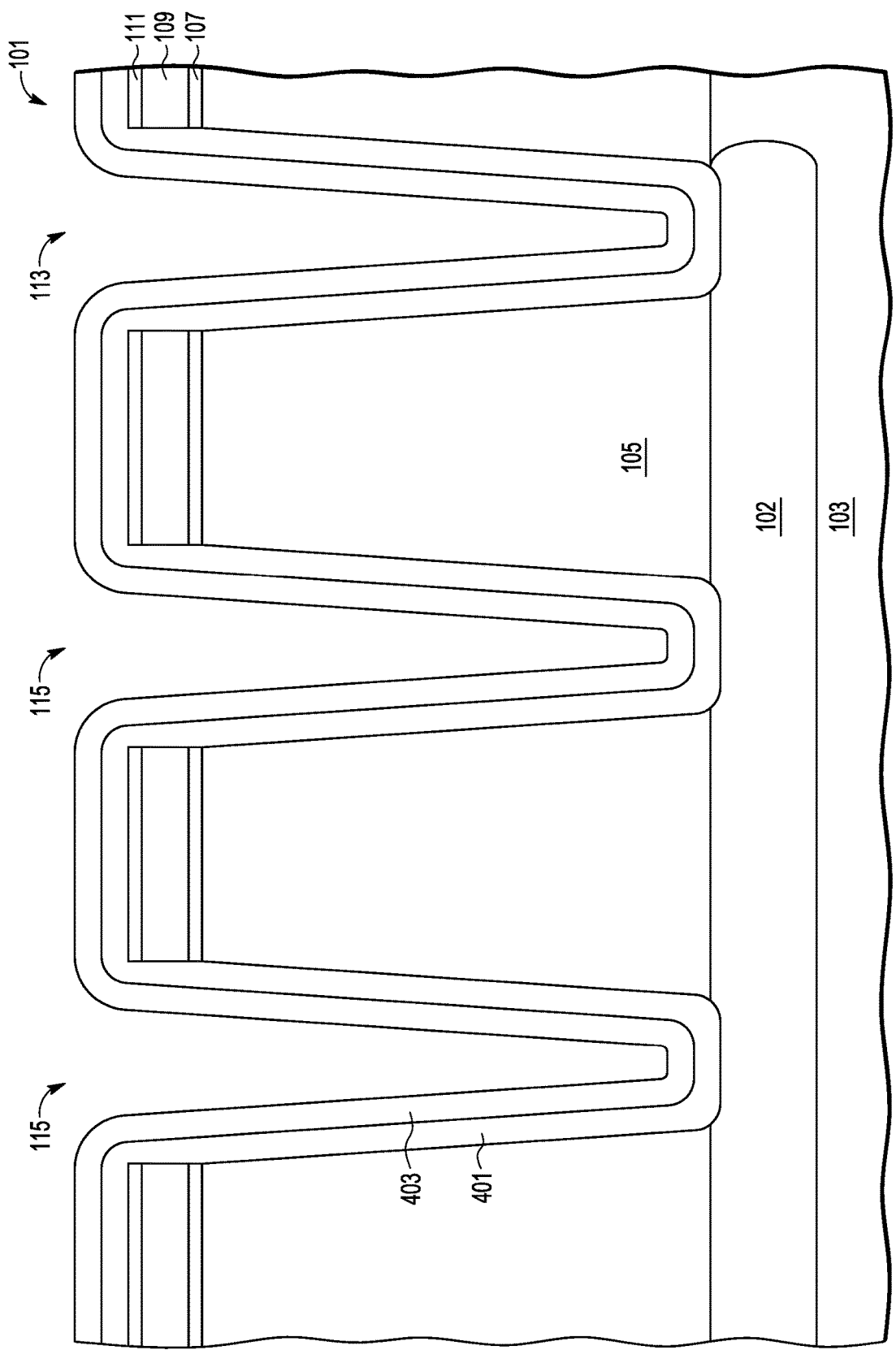

FIG. 4 is a partial cutaway side view of wafer 101 after a conformal layer 401 of oxide followed by a conformal layer 403 of field plate material are deposited over wafer 101. In one embodiment, oxide layer 401 has a thickness of 0.3 um and is deposited by a chemical vapor deposition process. However, in other embodiments, layer 401 may be formed by other processes (e.g. an oxidation process) or combinations thereof, have other thicknesses, and/or be made of other materials (e.g. another dielectric material). In one embodiment, layer 401 has a thickness so as to provide an adequate spacing between a subsequently formed field plate structure (e.g. 501 in FIG. 5) and the sidewall of layer 105 in a bottom part of a trench (e.g. 115) so as to provide a field dielectric thickness which can be optimized for BV and RonA.

Layer 403 is a layer of conductive field plate material, which in one embodiment is doped polysilicon, but may be of other materials in other embodiments. In one embodiment, layer 403 is formed by chemical vapor deposition process and has a thickness of about 0.25 um, but may be formed by other methods and/or have other thicknesses in other embodiments.

Figure 5:
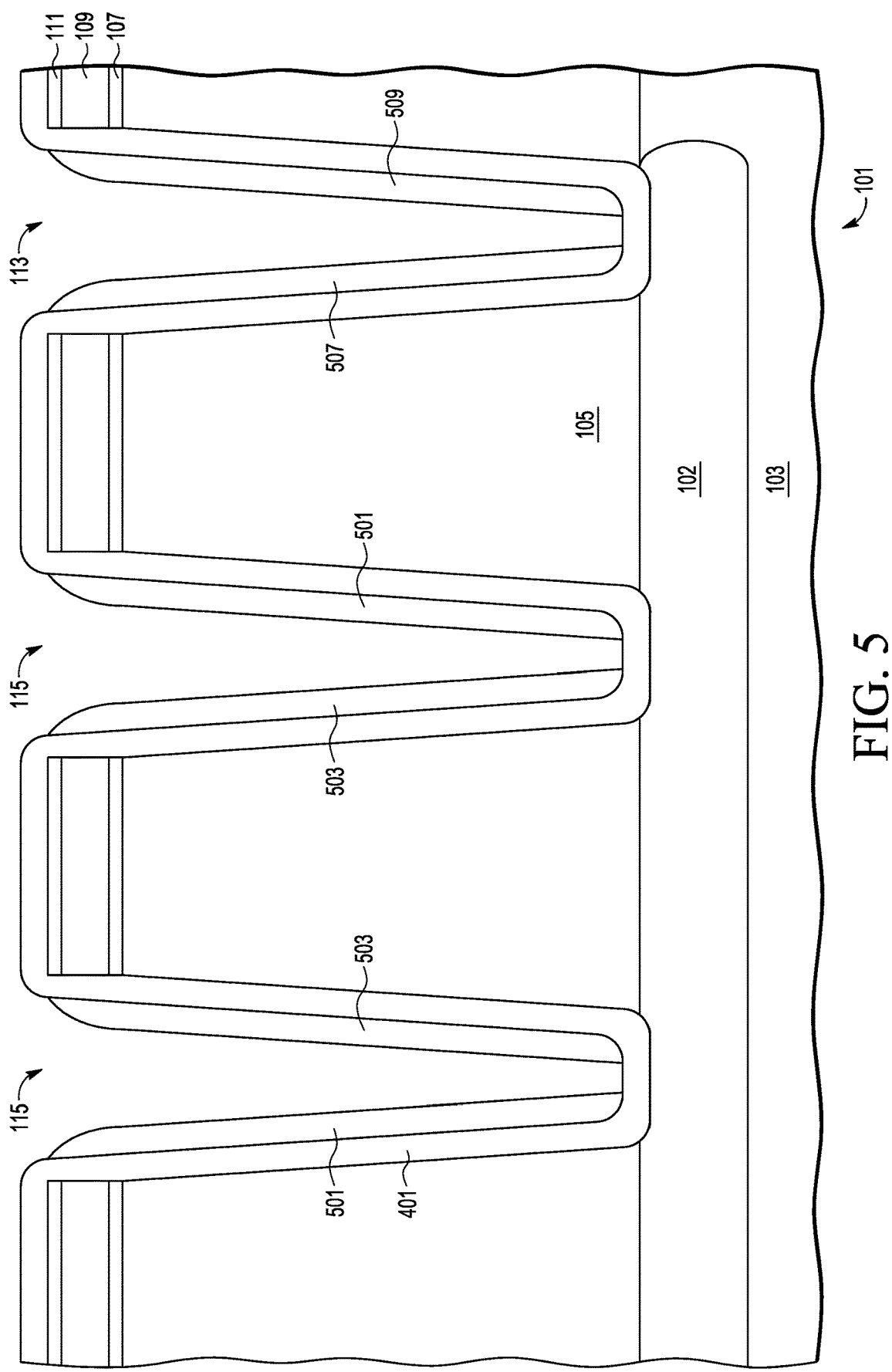

FIG. 5 shows a partial side view of wafer 101 after layer 403 has been anisotropically etched to separate layer 403 into field plate structures 501 and 503 in trench 115 and into field plate structures 501 and 509 in trench 113. In one embodiment, layer 403 is etched with an etch chemistry that is selective to the material (e.g. polysilicon) of layer 403 and is selective with respect to the material (e.g. oxide) of layer 401. In the embodiments shown, layer 403 is etched for a time such that the material of layer 403 is removed from outside of the trenches above the top surface of layer 401. The etching removes a portion of layer 403 located at the bottom of each trench to physically separate layer 403 into two trench structures. The etching may also recess the top portion of field plate structures 501, 503, 507, and 509 in the trenches.

Figure 6:
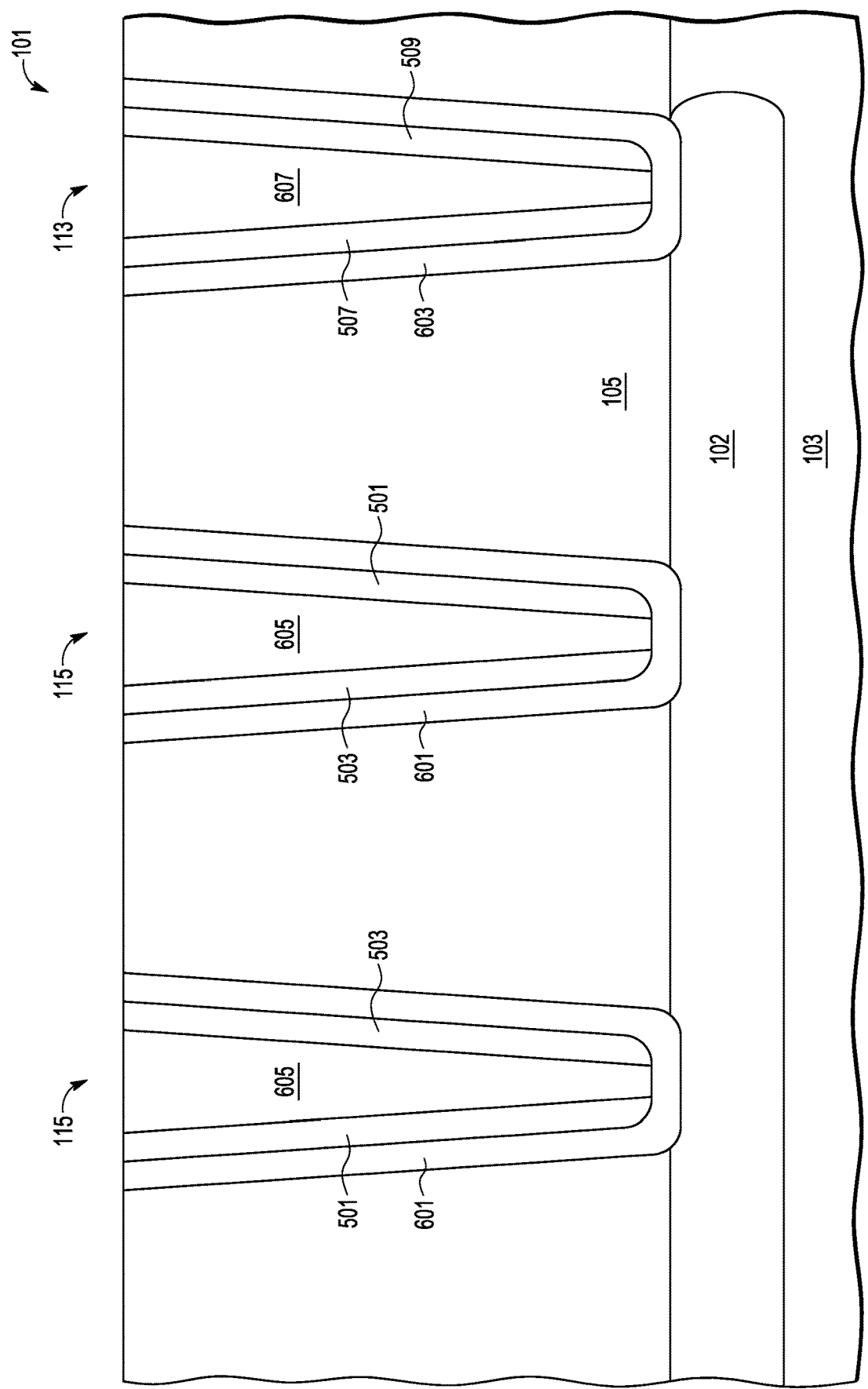

FIG. 6 shows a partial side view after the trenches 115 and 113 are filled with a dielectric material (e.g. an oxide) and wafer 101 is planarized to remove hard mask layers 107, 109 and 111. The planarization forms dielectric material structure 605 in between the field plate structures 501 and 501 and forms dielectric material structure 607 in between field plate structures 507 and 509. The planarization also forms oxide structures 601 in trench 115 and oxide structure 603 in trench 113 from layer 401.

Figure 7:
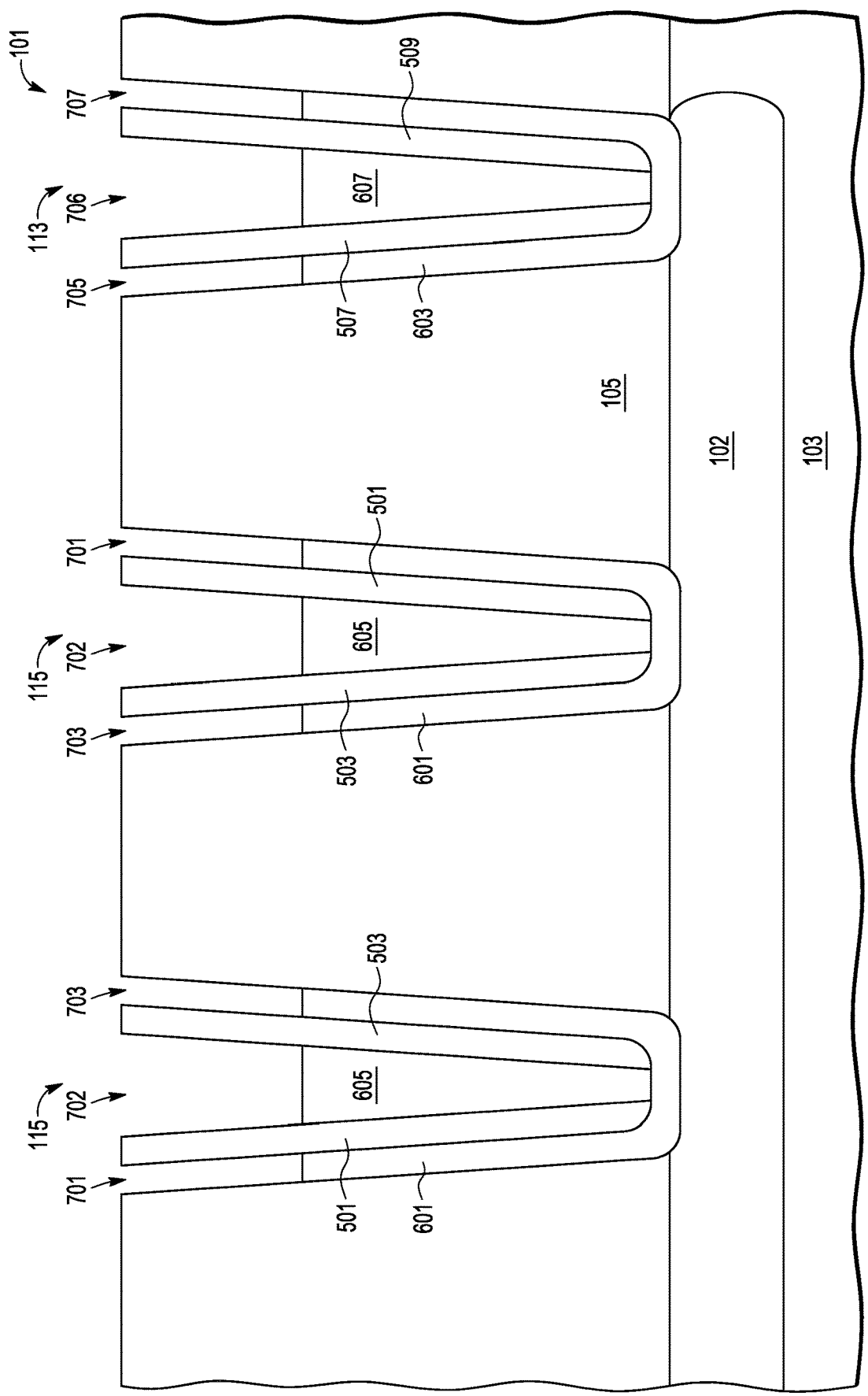

FIG. 7 shows a partial cutaway side view after wafer 101 has been subjected to a timed etch to remove a portion of the oxide in trenches 115 and 113. In one embodiment, the etch is an isotropic etch that creates trenches 701, 702, 703, 705, 706, and 707 each having a depth (e.g. 1 um) such that a subsequently formed gate structure (e.g. 901 in FIG. 9) can extend a desired channel length into the trench.

Figure 8:
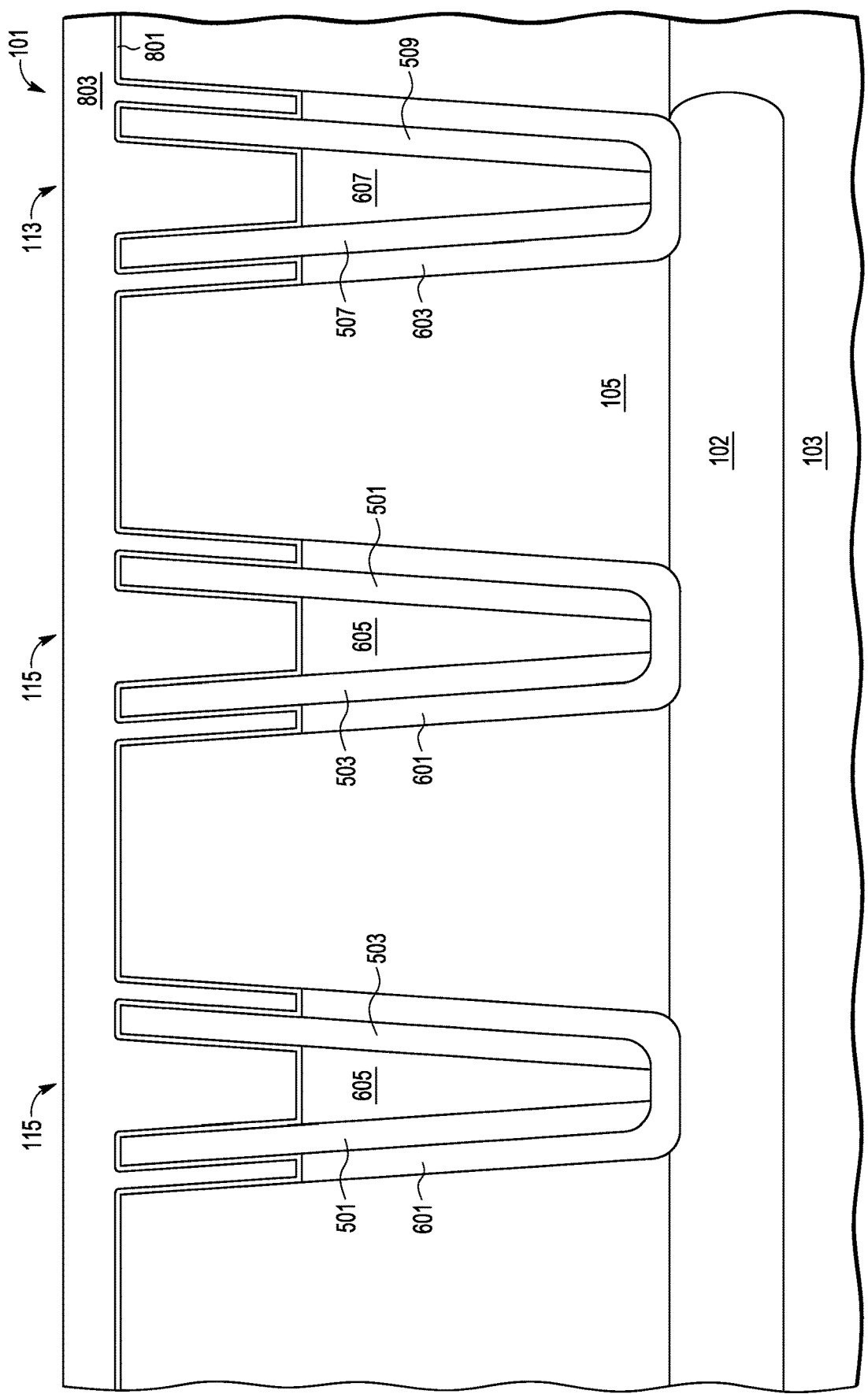

FIG. 8 shows a partial side view of wafer 101 after a layer 801 of gate dielectric is formed on wafer 101 and a layer 803 of gate material is formed on layer 801. In one embodiment, layer 801 is an oxide that can formed by a deposition process. However, in other embodiments, layer 801 is formed by an oxidation process. In one embodiment layer 801 is made of silicon oxide and has a thickness of about 150 A for a 5 Volts gate-source voltage rating but may be made of other materials and/or have other thicknesses in other embodiments depending on targeted gate-source voltage requirement.

In one embodiment, layer 803 is made of doped polysilicon and has a thickness that is sufficient to completely fill trenches 701, 702, 703, 705, 706, and 707.

Figure 9:
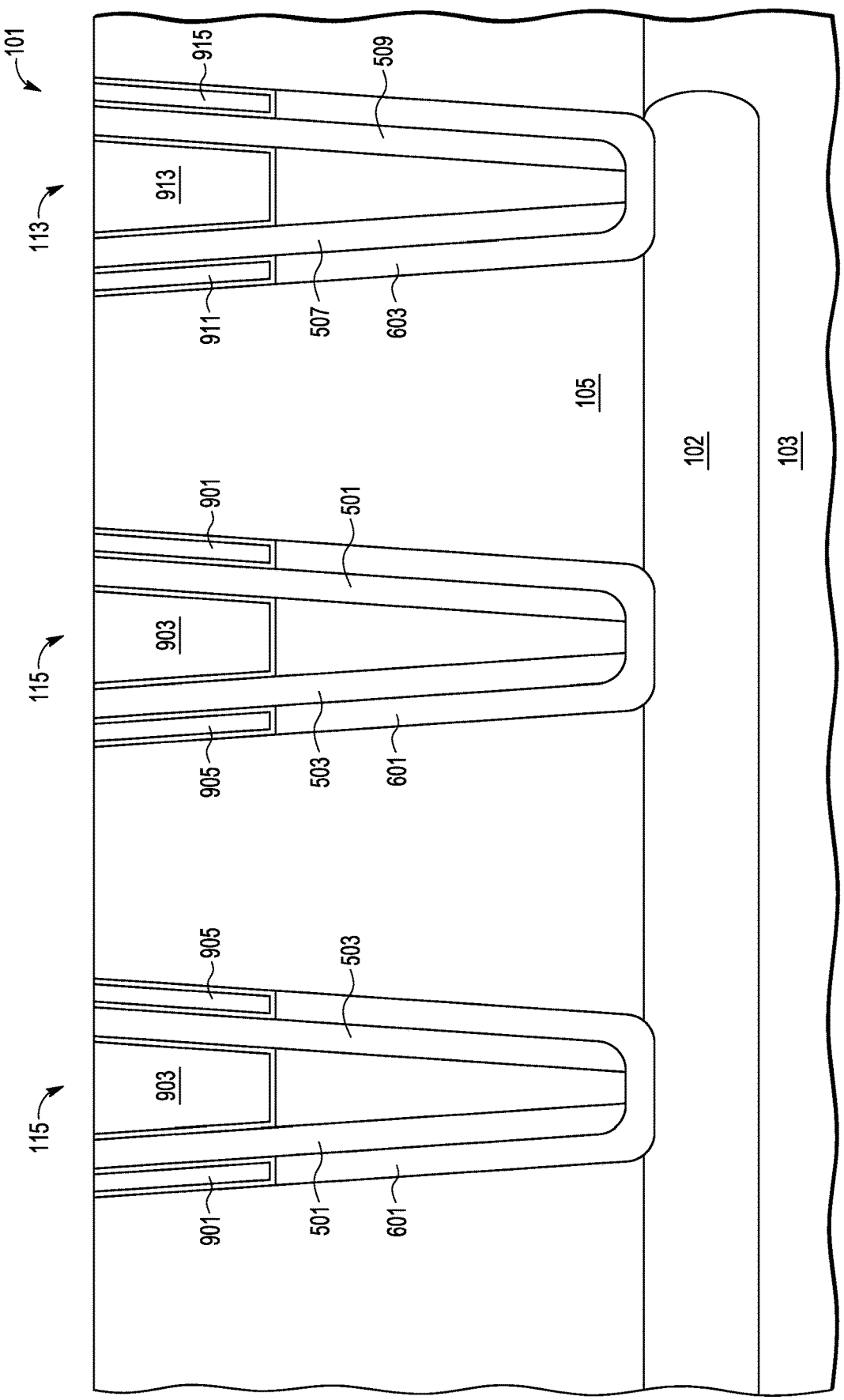

FIG. 9 is a partial cutaway side view of wafer 101 after wafer 101 has been planarized to form gate structures 901, 905, 911, and 915 as well as structures 903 and 913 from layer 803.

Figure 10:
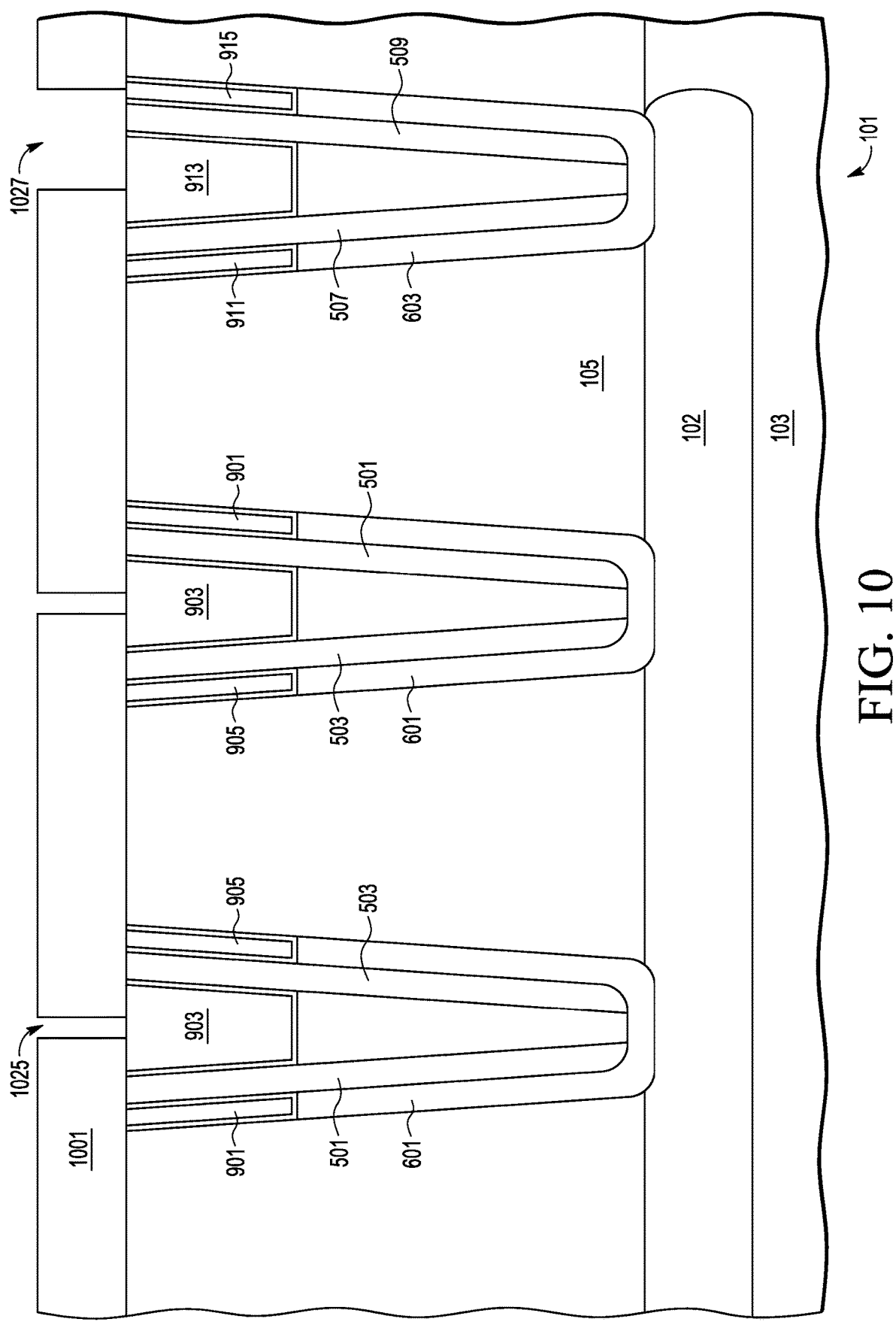

FIG. 10 shows a partial cutaway side view of wafer 101 after a patterned mask 1001 is formed with openings 1025 and 1027 to expose polysilicon structures 903, 913, 509, and 915 for removal with an isotropic etchant.

Figure 11:
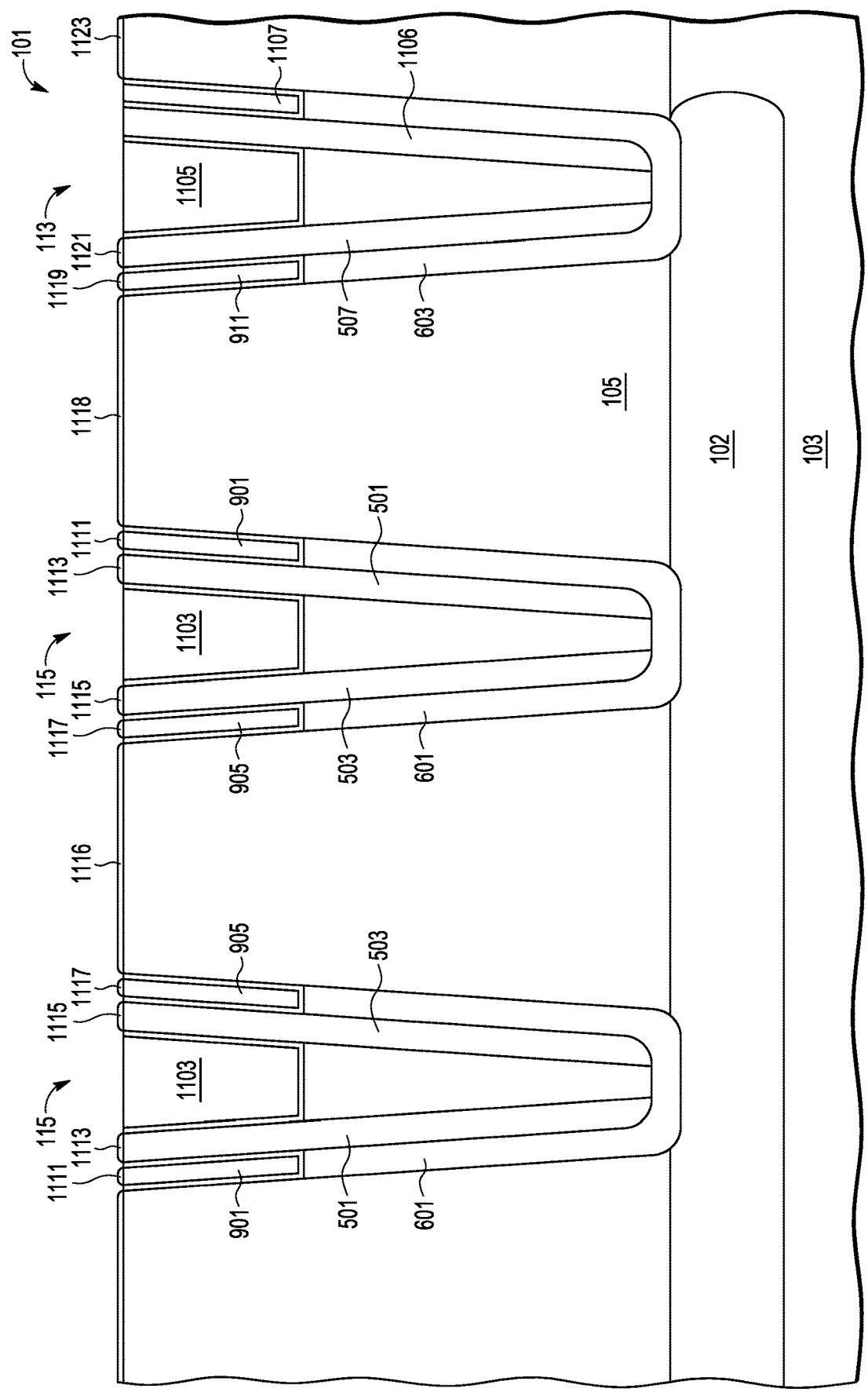

FIG. 11 is a partial cutaway side view of wafer 101 after a layer of dielectric material (not shown) is formed on wafer 101 and then wafer 101 is planarized to form dielectric structures 1103, 1105, 1106, and 1107 to fill the openings created by the removal of structures 903, 913, 509, and 915, respectively. Afterwards, wafer 101 is subject to an oxidation process to form seal oxide structures 1111, 1113, 1115, 1116, 1117, 1118, 1119, 1121, and 1123. In one embodiment, these structures have a thickness in the range of 200 A, but may have other thickness and/or be formed by other processes in other embodiments.

Figure 12:
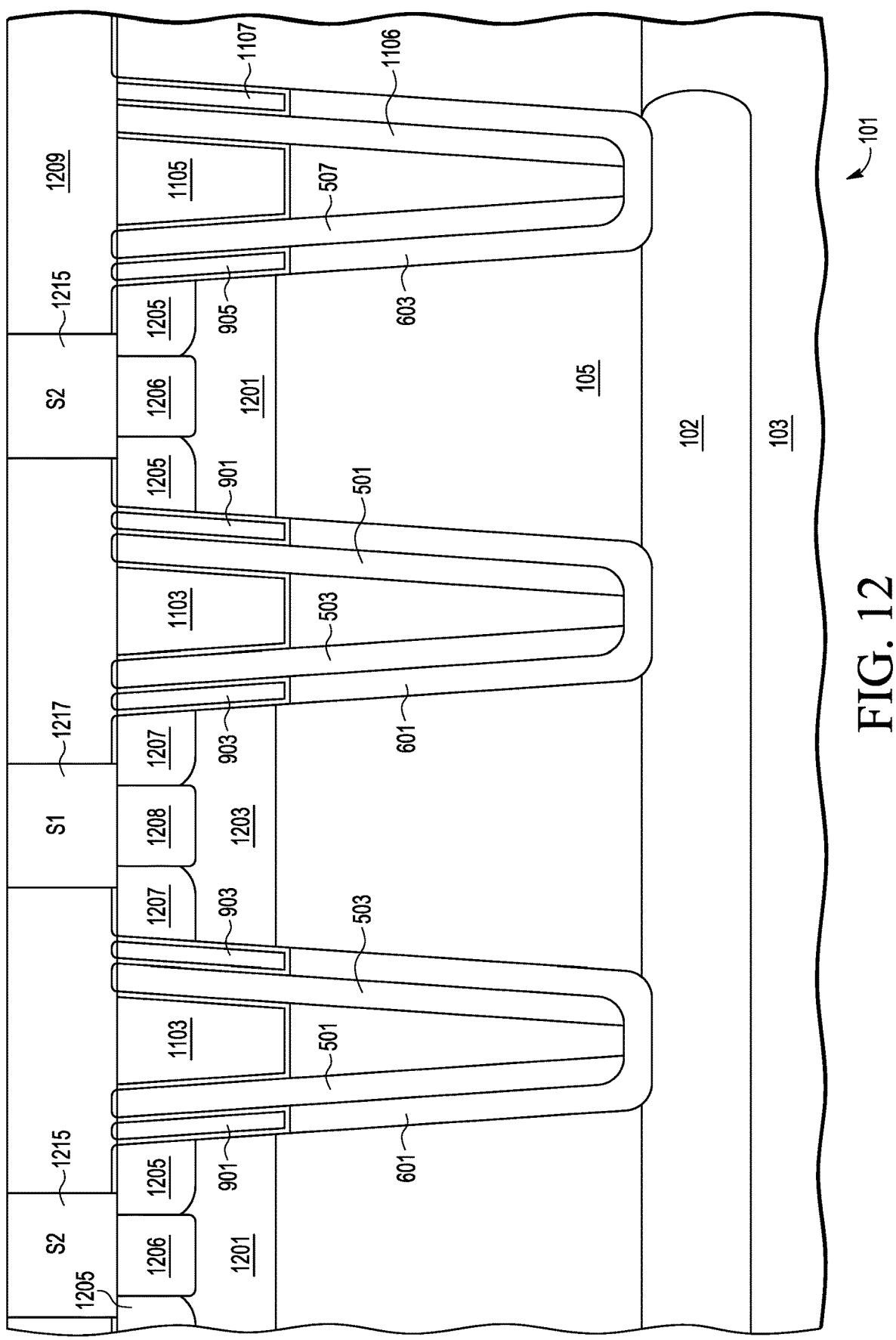

FIG. 12 is a partial cutaway side view of wafer 101 after P-well regions 1201 and 1203 are formed in layer 105 by the ion implantation of P-type dopants (e.g. boron) into layer 105. In one embodiment, boron is implanted at an energy of 180 keV and dosage of 1.2e13 cm−2, but may be implanted at other energies and/or other dosages in other embodiments. In one embodiment, implantation is followed by an annealing step.

Afterwards, source regions 1205 and 1207 and body contact regions 1206 and 1208 are formed by the selective implantation of N type dopants and P-type dopants into P-well regions 1201 and 1203, respectively. The N-type dopant ions are implanted through a patterned implant mask (not shown) formed on wafer 101. In one embodiment, arsenic ions at a dose of 5e15 cm−2 are implanted at 120 keV, and phosphorus ions at a dose of 1.5e15 cm−2 are implanted at 55 keV. Other N-type dopants may be implanted at other doses and/or at other energies in other embodiments. Furthermore, in this exemplary embodiment, boron ions are implanted through a designated patterned implant mask (not shown) formed on wafer 101 with a dose of 1.5e15 cm−2 and energy of 25 keV to form body contact regions 1206 and 1208. Implantation is followed by and annealing step, e.g. rapid thermal annealing (RTA).

After the formation of source regions 1205 and 1207 and body contact regions 1206 and 1208, a layer 1209 of interlevel dielectric material is formed on wafer 101. In one embodiment, layer 1209 is an oxide formed by a TEOS process, but may be of another material in other embodiments. Openings are then formed in layer 1209 for the formation of metal contacts to electrically contact the transistor structures. In the embodiment shown, contact 1215 contacts both source region 1205 and P-well region 1201. Contact 1217 contacts both source region 1207 and body contact region 1208. In other embodiments, the source regions and body contact regions may have different contacts to be individually biased at different voltages. Not shown in the partial cutaway view of FIG. 12 are contacts for gate structures 901, 903, and 905 or the contacts for field plate structures 501, 503, and 507. These contacts are located outside of the cutaway view of FIG. 12.

In the view shown, contact 1215 is contiguous and wraps around contact 1217 such that it appears in two places in the view of FIG. 12. However, other embodiments may include multiple contacts for contacting a source region/well region or gate structure at different locations wherein the multiple contacts are electrically tied together at higher interconnect layers (not shown). Also, in some embodiments, substrate 103 can be biased by a contact (not shown) contacting a P-type sinker region (not shown) located outside of termination trench 113. In some embodiments, the P-type sinker region may be utilized to isolate the bi-directional transistor device from other devices (not shown) implemented in the same integrated circuit die.

After the stage shown in FIG. 12, other processes may be performed on wafer 101 such as forming additional interconnect layers. For example, interconnects may be formed to electrically couple together gate structures 905 and 901 and to electrically couple together field plate structures 507 and 501. Afterwards, external terminals e.g. bond pads are formed on wafer 101. Wafer 101 is then singulated into multiple die where each die includes at least one bi-directional transistor device having structures shown in FIGS. 1-12. Afterwards, the die are packaged in semiconductor packaging material to form integrated circuit packages where they are shipped to end use manufacturers to include in end use products such as automobiles, battery control systems, and industrial equipment. In other embodiments, a transistor may include other structures and/or may be formed by other processes. Furthermore, additional process steps may be added to form other components on the same substrate.

Figure 13:
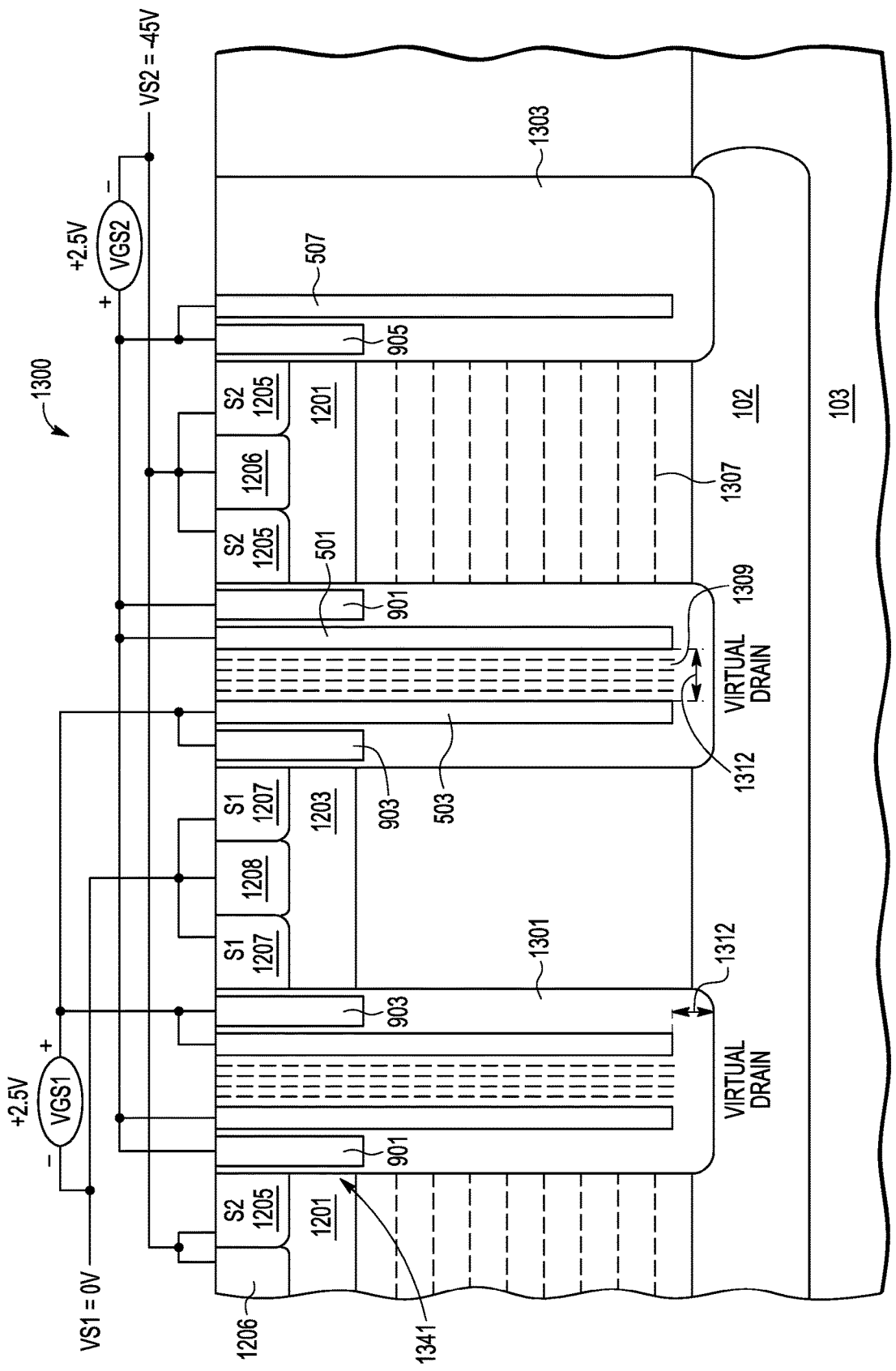
FIG. 13 is a partial side view illustration showing potential fields and the electrical coupling of a semiconductor device during an operating condition according to one embodiment of the present invention.

FIG. 13 is a partial side view of the transistors formed in the area shown in FIGS. 2 and 3 and whose stages of manufacture are shown in the cross sections of FIGS. 1 and 4-12. The transistors are configured in a back-to-back configuration to implement a bi-directional device 1300. The view of FIG. 13 shows voltages applied to the transistor structures during one operating condition and some of the equipotential field lines generated from the electrostatic fields when device 1300 is in the particular operating condition. Note that not all the equipotential field lines of the electrostatic fields generated from the operating condition are shown in FIG. 13. FIG. 13 shows the individual conductive structures (e.g. field plate structures 501, 503, 507, gate structures 903, 901, 905) in trench structures 1301 and 1303 but does not individually show the dielectric structures (e.g. 601, 1107) of the trench structures which are shown in FIG. 12. In some embodiments, a portion of the dielectric of a trench structure may include an air gap.

In the embodiment shown, gate structure 901, gate structure 905, field plate structure 501, and field plate structure 507 are all electrically coupled together to be at same potential during operation. In one embodiment, each of these structures includes a contact (not shown) that are electrically coupled together in an interconnect layer. In other embodiments, a contact (not shown) would contact both a gate structure (901) and a corresponding field plate structure (501) to electrically couple the two structures together. Gate structures 901 and 905 form the gate for one transistor (having the source regions implemented in area S2 of FIGS. 2 and 3) of the back to back transistor configuration (see transistor 1503 of FIG. 15). Field plate structure 503 and gate structure 903 are electrically coupled together to be at the same potential during operation. Gate structure 903 forms the gate for the other transistor of the back to back transistor configuration, which has the source regions implemented in area S1 of FIGS. 2 and 3 (see transistor 1501 of FIG. 15). When a gate is biased for a transistor to be conductive, a channel region (1314) forms along the trench structure sidewall of the P-well region (1201) between the source region (1205) and layer 105. In one embodiment, the channel region is characterized as a vertical channel region.

In the embodiment shown, both transistors are in a conductive state. Gate structures 901 and 905 are biased at 2.5 volts higher (−42.5 Volts) than source region 1205 (which is biased at −45 Volts) such that a channel region forms along the side wall of P-well region 1201 along trench structures 1301 and 1303 adjacent to gate structures 901 and 905, respectively. In the embodiment shown, source region 1207 is biased at 0 Volts. Gate structure 903 and field plate structure 503 are biased at 2.5 Volts such that that transistor is conductive as well.

As shown in FIG. 13, a potential difference exists between source region 1205 (biased at −45 Volts) and substrate 103 (biased as 0 Volts). Because field plate structures 501 and 507 are electrically coupled to their corresponding gate structures 901 and 905, respectively, the voltage difference between source region 1205 and substrate 103 can be supported along the length of trench structures 1301 and 1303 towards region 102. See equipotential lines 1307 in FIG. 13. In some embodiments, the field plates provide a RESURF effect and assist in depleting the semiconductor region between the trench structures such that the potential drop is distributed vertically between well regions 1201 and 1203 and region 102. Employing the field plates in this manner allows for increased BV. Alternatively, the field plates may allow for a higher N-type net doping concentration in layer 105 below the P-wells to reduce the RonA while maintaining the breakdown voltage of the device within acceptable ranges for the intended application. It should be appreciated, that the depth of the trench, the depth and doping concentration of layer 105, the trench spacing determining the width of the semiconductor region, as well as the field oxide thickness of layer 401 may be balanced for optimal performance.

In other embodiments, other voltages may be applied to the source regions in other applications. For example, source region 1207 may be biased at a negative voltage (e.g. −45 Volts) or at a positive voltage (+45 Volts). Source region 1205 may be biased at ground (0 Volts) or at a positive voltage. These voltages may be applied when the device is conductive or nonconductive. Accordingly, the bi-directional device shown in FIG. 13 can be implemented in both a forward biased application or a reversed biased application. In other embodiments, a bi-directional transistor device may be designed to operate with greater magnitude voltages (e.g. ±130 Volts) or lessor magnitude voltages (e.g. ±30 Volts) being applied to its structures. In these voltages, certain parameters such as e.g. trench width, trench depth, and drain doping levels may be adjusted to provide a device with higher breakdown voltages or lower breakdown voltages as needed or to optimize performance.

In the embodiment shown, the heavy N type doping of region 102 provides for improved symmetry between the forward and reverse bias directions of the bi-directional device and also reduces the RonA of the device. In the embodiment shown, because the heavier doping of region 102 is located at the bottom of a trench structure (1301, 1303) and not along the sidewall of the trench structure where voltage dissipation occurs (see equipotential lines 1307), the RonA resistance can be reduced without decreasing the breakdown voltage of the bidirectional device. In one embodiment, the bi-directional device 1300 has a breakdown voltage of 60 Volts with a RonA of 41 mOhmmm$^2$, however other devices may have other values for these parameters in other embodiments.

In other embodiments, region 102 would not be heavily doped but instead would have the same net conductivity as the portion of layer 105 below the P-well regions 1201 and 1203. In one such embodiment, a bi-directional device with this configuration may have a forward breakdown voltage of 64 Volts, a reverse breakdown voltage of 63 Volts, and a RonA of 51 mOhmmm2. However, these parameters may be of other values in other embodiments.

In some embodiments, the N-type net conductivity concentration in layer 105 directly below P-well region 1201 (in the S2 area of FIGS. 2 and 3) and the N-type net conductivity concentration in layer 105 directly below P-well region 1203 are different from each other which provides for different RonA and breakdown voltages in the forward and reverse bias conditions. These embodiments may be used where symmetric operating characteristics are not needed. A lower BV requirement in one operating direction may allow for increased doping concentration in S1 or S2 regions for improved total RonA.

Also shown in FIG. 13 are the equipotential lines representing of the electrostatic fields within trench structure 1301 that occur between field plate structures 501 and 503 for the operating condition shown in FIG. 13. In the embodiment shown, field plate structure 501 is biased at −42.5 Volts and field plate structure 503 is biased at 2.5 Volts. This electrostatic field is dissipated in the dielectric material of trench structure 1301 that is laterally between the field plate structures. In one embodiment, the lateral distance 1312 between the field plate structures is set to meet the desired breakdown voltage requirements for the bi-directional transistor devices of a particular application. In one embodiment, distance 1312 is about 0.5 um, but may be other distances in other embodiments. The distance 1312 is also dependent on the type of dielectric material between the field plate structures.

Each field plate structure 501, 503, and 507 is separated vertically from the bottom of the trench structure 1301 by distance 1321. In the embodiment shown, distance 1321 is set by the thickness of layer 401. In other embodiments, it may be beneficial to adjust the distance 1321 for optimal performance.

As shown in FIG. 13, the drain region for both transistors is characterized as a "virtual drain" in that it is not biased at a particular voltage with a direct external contact and it is an internal node of a bi-directional device which can be characterized as drain connected back-to-back transistors. In one embodiment, the virtual drain includes portions of region 102 directionally below and adjacent to a trench structure (1301) and portions of layer 105 forming extended drain regions directly below P-well regions 1201 and 1203 located along the sidewalls of a trench structure.

In the embodiment shown, the substrate 103 is biased at a ground voltage. In other embodiments, substrate 103 may be biased at the lowest source voltage (e.g. −45 V) to provide more symmetry in the forward and reverse biased conditions.

In some embodiments, providing a trench structure (1301) with two field plate structures may enable a bi-directional device to occupy less integrated surface area and provide for a lower RonA. If a trench structure (e.g. 1301) were to include only one field plate structure, then there would have to be a spacing 1312 between each gate structure (e.g. 901, 903) and the single field plate structure for the device to be bidirectional so as to dissipate the electrostatic fields due to the voltage differential to allow the single field plate to be biased at about the high or the low potential depending on blocking direction. However, with two field plate structures per trench, the distance between the gate structure and corresponding field plate structure can be a minimal distance or the two structures can be in contact when they are electrically tied together. Accordingly, by using two field plates, the width of a trench structure can be reduced. Moreover, in some embodiments, the reduced voltage requirement between a gate and a corresponding field plate when using two field plate structures eliminates additional constraints in optimizing the thickness of field oxide layer 401 for improved device performance. In some embodiments, a narrower trench structure lowers the RonA of the bi-directional device.

In some embodiments, a termination trench structure 1303 is included in a bi-directional transistor device to maintain a sufficient a voltage breakdown in the peripheral areas of the device near the termination trench. As shown in the embodiments of FIGS. 12 and 13, field plate structure 509 and gate structure 915 have been removed from termination trench structure 1303. However, in other embodiments, field plate structure 509 and/or gate structure 915 may remain in trench structure 1303. In some embodiments, field plate structure 509 and/or gate structure 915 would remain and be electrically coupled to system ground (0 Volts). In other embodiments, field plate 509 and/or gate structure 915 would remain and be tied to field plate structure 507.

In some embodiments, the gate driver circuits (see driver circuits 1505 and 1507) for controlling the voltage of gate structures 901, 903, and 905 is located on the same integrated circuit as the bi-directional transistor device. However, in other embodiments, the driver circuits may be located on a separate integrated circuit chip.

Figure 14:
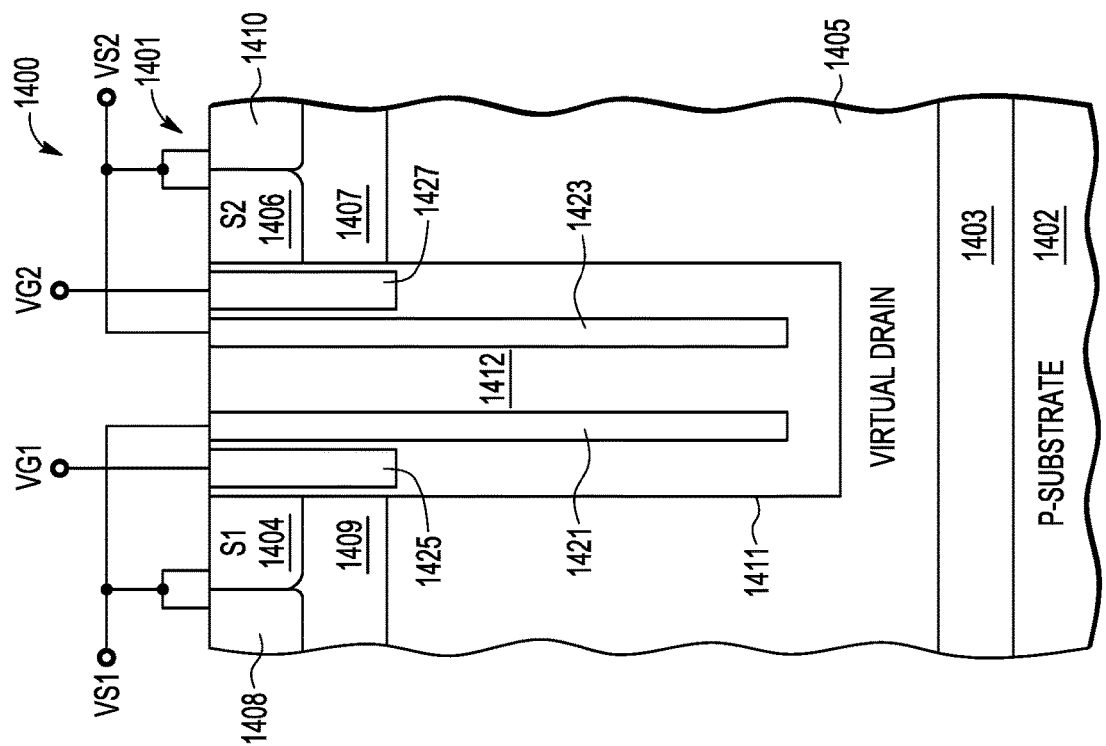
FIG. 14 is a partial cutaway side view illustration of another embodiment of the present invention.

FIG. 14 shows a partial cutaway sideview of a trench structure 1411 for a bi-directional transistor device according to another embodiment of the present invention. Although the view of FIG. 14 shows trench structure 1411 in its cross section, a bi-directional transistor device 1400 may include multiple trench structures in a full cross-sectional view through the device. Also, the device may include a termination trench structure (not shown) similar to termination trench structure 1303 that surrounds trench structure 1411.

Bi-directional transistor device 1400 includes two transistors with one transistor including source region 1404, body contact region 1408, P-well 1409, gate structure 1425, and field plate structure 1421. The other transistor includes source region 1406, body contact region 1410, P-well 1407, gate structure 1427, and field plate structure 1423. Gate structure 1425, field plate structure 1421, field plate structure 1423, and gate structure 1427 are located in trench structure 1411 along with a dielectric 1412 (e.g. oxide). In the embodiment shown, field plate structure 1421 is electrically coupled to both source region 1404 and body contact region 1408 to be biased at the same potential during operation. Field plate structure 1423 is electrically coupled to both source region 1406 and body contact region 1410 to be biased at the same potential during operation. Biasing the field plate structures to the source regions and not to the gate structures (1425, 1427) may in some embodiments, reduce the gate capacitances of the transistors, which may lead to better device performance. However, in other embodiments (similar to FIG. 13), the field plate structures 1421 and 1423 are electrically coupled to the gate structures, which may provide for less complex manufacturing. The virtual drain for both transistors is located in layer 1405 directly beneath P-wells 1409 and 1407 along the side of trench structure 1411 and directly below trench structure 1411. Source region 1404 is electrically coupled to body contact region 1408 and source region 1406 is electrically coupled to body contact region 1410.

The embodiment of FIG. 14 is fabricated on a semiconductor on insulator (SOI) wafer 1401 that includes a semiconductor layer 1405 located directly over a dielectric layer 1403, which is located directly over a P-type substrate 1402. P-wells 1409 and 1407, source regions 1404 and 1406, and body contact regions 1408 and 1410 are implanted into layer 1405. Trench structure 1411 may be formed in a similar manner as shown in FIGS. 1 and 4-12 as the processes described with respect to FIGS. 1 and 4-14 may advantageously enable the gate structures and the field plate structures in a trench structure to be electrically biased as different potentials. In one embodiment, layer 105 has a thickness of 4.5 um and dielectric layer 1403 has a thickness of 0.3 um, but these layers may have other thicknesses in other embodiments. In some embodiments, a buried heavy N-type region (not shown) similar to region 102 can be formed in layer 105 to reduce the RonA of the transistors.

In one embodiment, substrate 1402 is biased at ground (0 Volts) but may be biased at other voltages e.g. at the lower source voltage to increase symmetry in the forward and reverse bias conditions.

In one embodiment, bi-directional device 1400 has a breakdown voltage of 64 Volts in both directions with a RonA of 52 mOhmmm$^2$. However, these parameters may be of other values in other embodiments.

Figure 15:
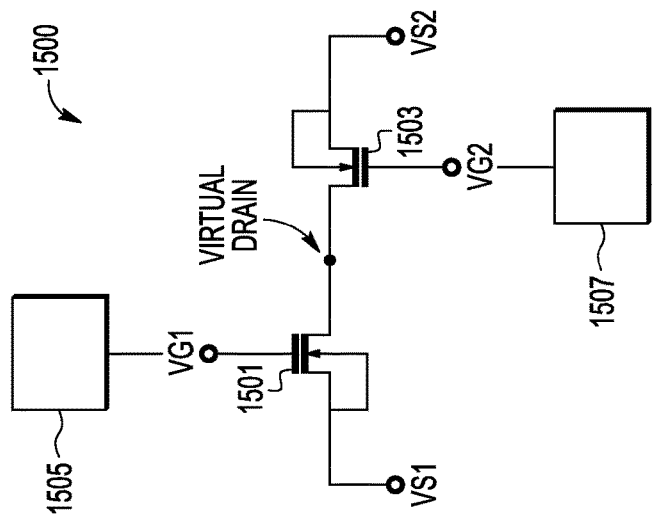
FIG. 15 is a circuit diagram showing back-to-back configured transistors.

FIG. 15 is a circuit diagram of a drain connected back to back transistor circuit 1500 that can be utilized as a bi-directional switch. Conventionally, transistors 1501 and 1503 would be implemented as separate devices in a circuit as shown. In contrast, embodiments of this invention integrate both FET's into a bidirectional device that share a common drain region as a virtual internal node. Circuit 1500 includes a first transistor 1501 and a second transistor 1503. In the embodiments of FIGS. 2 and 3, the source and channel regions of transistor 1501 are implemented in the areas designated by S1 and the source and channel regions of transistor 1503 are implemented in the areas designated S2. Driver circuit 1505 controls the gate voltage for the gate of transistor 1501 and driver circuit 1507 controls the gate voltage of the gate of transistor 1503. In one embodiment, circuit 1500 can be utilized as a switch between a node connected to the source of transistor 1501 and a node connected to the source of transistor 1503, regardless of which node is at the higher voltage.

Although the transistors described above are NFETs, the processes shown and described above can be used to make PFETs as well by switching the net conductivity type of at least some of the semiconductor regions. They may also be used to make other types of transistors in other embodiments.

A bidirectional transistor device is a device that can selectively block voltages in both directions and conduct current in both directions. However, some embodiments may be implemented as other types of transistor devices.

As disclosed herein, a first structure is "directly over" a second structure if the first structure is located over the second structure in a line having a direction that is perpendicular with the generally planar major side of the wafer. For example, in FIG. 12, contact 1215 is directly over region 102. Contact 1215 is not directly over P-well region 1203. As disclosed herein, a first structure is "directly beneath" a second structure if the first structure is located beneath the second structure in a line having a direction that is perpendicular with the generally planar major side of the wafer. For example, in FIG. 12, gate structure 905 is directly beneath layer 1209. Gate structure 905 is not directly beneath contact 1215. One structure is "directly between" two other structures in a line if the two structures are located on opposite sides of the one structure in the line. For example, in FIG. 12, field plate structure 501 is located directly between gate structure 901 and gate structure 903 in a line in the cut away side view of FIG. 12. Region 102 is not located directly between structures 903 and 901 in a line. A "lateral line" is a line that is parallel with a generally planar major side of the wafer. In FIG. 12, structure 903 and field plate structure 507 are located in a lateral line. Contact 1215 and region 102 are not located in a lateral line.

Features shown or described herein with respect to one embodiment may be implemented in other embodiments shown or described herein.

In one embodiment, a transistor device includes a first source region for a first transistor, a first well region for the first transistor, a second source region for a second transistor, a second well region for the second transistor, and a trench structure located directly laterally between the first well region and the second well region. The trench structure includes a first gate structure for the first transistor, a second gate structure for the second transistor, a first conductive field plate structure, and a second conductive field plate structure. The first gate structure and the second gate structure each include portions located in the trench structure directly laterally between the first well region and the second well region. The first conductive field plate structure and the second conductive field plate structure each include portions located directly laterally between the first gate structure and the second gate structure. The transistor device includes a drain region for the first transistor and the second transistor including a portion located directly below the trench structure.

In another embodiment, a method for making a transistor device includes forming a trench in a substrate, forming a layer of field plate material in the trench, separating the layer of field plate material in the trench into a first conductive field plate structure and a second conductive field plate structure, forming a dielectric separation between the first conductive field plate structure and the second conductive field plate structure in the trench, forming a first gate structure for a first transistor in the trench, forming a second gate structure for a second transistor in the trench, and forming a first source region in a first well region of the substrate adjacent a first sidewall of the trench. The first source region is for the first transistor. The method includes forming a second source region in a second well region in the substrate adjacent to a second sidewall of the trench opposing the first sidewall of the trench. The second source region is for the second transistor. A drain region for the first transistor and the second transistor includes a portion that is located directly below the trench. The first gate structure, the first conductive field plate structure, the second conductive field plate structure, and the second gate structure are located in the trench in a lateral line between the first well region and the second well region. A dielectric is located in the trench and separates the first conductive field plate structure from the second conductive field plate structure in the lateral line.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A transistor device comprising:
   a first source region for a first transistor;
   a first well region for the first transistor;
   a second source region for a second transistor;
   a second well region for the second transistor;
   a trench structure located directly laterally between the first well region and the second well region, the trench structure including:
      a first gate structure for the first transistor;
      a second gate structure for the second transistor;
      a first conductive field plate structure;
      a second conductive field plate structure;
      wherein the first gate structure and the second gate structure each include portions located in the trench structure directly laterally between the first well region and the second well region:
      wherein the first conductive field plate structure and the second conductive field plate structure each include portions located directly laterally between the first gate structure and the second gate structure;
   a drain region for the first transistor and the second transistor including a portion located directly below the trench structures;
   wherein the trench structure is located directly over a buried dielectric layer.

2. The transistor device of claim 1 wherein the first transistor is characterized as a field effect transistor and the second transistor is characterized as a field effect transistor.

3. The transistor device of claim 1 wherein the trench structure is located directly laterally between the first well region and the second well region along a lateral line, wherein the first conductive field plate structure and the second conductive field plate structure each extend lower in the trench structure from the lateral line than the first gate structure and the second gate structure.

4. The transistor device of claim 1 wherein the trench structure is located directly laterally between the first well region and the second well region along a lateral line, wherein the first conductive field plate structure is separated from the second conductive field plate structure laterally along the lateral line by a greater distance than the first gate structure is separated from the first conductive field plate structure along the lateral line and the second gate structure is separated from the second conductive field plate structure along the lateral line.

5. The transistor device of claim 1 wherein the first well region includes a first channel region for the first transistor located directly beneath the first source region and directly laterally to the first gate structure, the second well region includes a second channel region for the second transistor located directly beneath the second source region and directly laterally to the second gate structure, the first channel region and the second channel region are each characterized as vertical channel regions.

6. The transistor device of claim 1 wherein the first well region and the second well region each include portions having a net conductivity doping of a first type, the drain region includes a portion having a net conductivity of a second type at a first concentration, wherein a third region is located between the first well region and the drain region and a fourth region is located between the second well region and the drain region, the third region and the fourth region each having a net conductivity of the second type at a second concentration that is less than the first concentration.

7. The transistor device of claim 1 wherein the first conductive field plate structure is electrically coupled to the first source region to be biased a same potential during operation and the second conductive field plate structure is electrically coupled to the second source region to be biased a same potential during operation.

8. The transistor device of claim 1 wherein the first conductive field plate structure is electrically coupled to the first gate structure to be biased a same potential during operation and the second conductive field plate structure is electrically coupled to the second gate structure to be biased a same potential during operation.

9. A transistor device comprising:
a first source region for a first transistor;
a first well region for the first transistor;
a second source region for a second transistor;
a second well region for the second transistor;
a trench structure located directly laterally between the first well region and the second well region, the trench structure including:
  a first gate structure for the first transistor;
  a second gate structure for the second transistor;
  a first conductive field plate structure;
  a second conductive field plate structure;
  wherein the first gate structure and the second gate structure each include portions located in the trench structure directly laterally between the first well region and the second well region:
  wherein the first conductive field plate structure and the second conductive field plate structure each include portions located directly laterally between the first gate structure and the second gate structure;
a drain region for the first transistor and the second transistor including a portion located directly below the trench structure;
a second trench structure laterally surrounding the trench structure, the second well region located directly laterally between the trench structure and the second trench structure, the second trench structure including:
  a third gate structure;
  a third conductive field plate structure;
wherein the third gate structure is located directly laterally between the second conductive field plate structure and the third conductive field plate structure in a lateral line;
the second conductive field plate structure and the third conductive field plate structure are electrically coupled together to be biased at a same potential during operation.

10. The transistor device of claim 9 wherein the trench structure is located directly over a buried dielectric layer.

* * * * *